(12) United States Patent
Nagai et al.

(10) Patent No.: US 7,101,061 B2
(45) Date of Patent: Sep. 5, 2006

(54) LIGHT EMISSION APPARATUS

(75) Inventors: Hideo Nagai, Takatsuki (JP); Shozo Oshio, Hirakata (JP); Masaaki Yuri, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 244 days.

(21) Appl. No.: 10/688,829

(22) Filed: Oct. 17, 2003

(65) Prior Publication Data

US 2004/0129946 A1  Jul. 8, 2004

(30) Foreign Application Priority Data

Oct. 17, 2002 (JP) .............................. 2002-303508

(51) Int. Cl.
  *F21V 29/00* (2006.01)
  *F21V 21/00* (2006.01)
(52) U.S. Cl. ..................... 362/294; 362/244; 362/247
(58) Field of Classification Search .................. 362/84, 362/231, 240, 241, 244, 247, 249, 259, 294, 362/373, 800
See application file for complete search history.

(56) References Cited

U.S. PATENT DOCUMENTS

| | | | |
|---|---|---|---|
| 4,935,665 A * | 6/1990 | Murata ........................ 362/240 |
| 6,068,383 A * | 5/2000 | Robertson et al. ............ 362/84 |
| 6,084,250 A | 7/2000 | Justel et al. | |
| 6,186,649 B1 * | 2/2001 | Zou et al. .................... 362/347 |
| 6,715,901 B1 * | 4/2004 | Huang ......................... 362/294 |
| 2003/0189829 A1 * | 10/2003 | Shimizu et al. .............. 362/240 |

FOREIGN PATENT DOCUMENTS

| | | |
|---|---|---|
| JP | 2001-155628 | 6/2001 |
| WO | WO 98/39805 | 9/1998 |

* cited by examiner

Primary Examiner—Y. My Quach-Lee

(57) ABSTRACT

A light emission apparatus that can restrict deterioration of resin used for the light emission apparatus, and that has a reasonable structure fit for actual use is provided, in which a light reflective layer is provided to cover the side surfaces of the chips 26 provided in the concave 2a. According to this, excitation light reflected by the phosphor layer 32, such as ultraviolet light, is reflected again by the light reflective layer 27. Therefore, the excitation light will not reach the resin layer 21, thereby restraining the deterioration of the resin. Moreover, the light reflective layer 27 covers the side surfaces of the chips 26, thereby efficiently conducting the heat emitted from the chips 26 to the metal substrate 20 via the resin layer 21. This improves the heat-dissipation efficiency of the chips 26.

15 Claims, 15 Drawing Sheets

26

263

6

6

LIGHT EMISSION APPARATUS

BACKGROUND OF THE INVENTION (1) Field of the Invention

The present invention relates to a light emission apparatus used as a light source of an illumination apparatus and of a display, and in particular relates to a technology for restricting deterioration in resin materials used in such a light emission apparatus.

(2) Related Art

Recently, in the field of illumination apparatuses, LED is getting attention as a light source. This is because with LED, light emitting energy can be expected to be improved in the future by research and development. Moreover, with LED, a surface light source with high intensity can be obtained by mounting a plurality of LEDs.

An example of surface light source using LEDs is disclosed in "Optical display" Ohm MOOK Hikari series No. 2, Ohmsha Ltd., Feb. 25, 2002, p. 46–52. In this document, a plurality of shell-type white LEDs are arranged on a substrate. Here, the shell-type white LED has a structure of molding LED chips emitting light having comparatively high energy such as blue to violet light (hereinafter, such a light is referred to as "excitation light"), with use of a resin in which phosphor particles that emit red, green, and blue lights by means of the excitation light are mixed (refer to published Japanese translation of a PCT application No. 2000-509912).

Incidentally, the resin generally deteriorates because the atom coupling is cut by means of the energy that the light has. In particular, the excitation light has a high energy, and so the deterioration in resin is prominent.

With the shell-type white LED, its chip has been molded by a resin. The resin is easy to deteriorate by means of the excitation light, and so turns yellow thereby changing light-emitting color, or cracks which then incurs entry of water, thereby deactivating the phosphor particles from the entered water, or increasing leak current in a case where the water adheres to the surface of the LED chips. In addition, the shell-type white LEDs are so-called discrete parts that emit white light independently from one another, therefore have limitation in enhancing mounting density, and incur large cost.

In view of the above problems, it is desired to structure a high-intensity surface light source, without using such a shell-type white LED.

In order to satisfy such a request, a hybrid structure has been considered in which LED chips, in a necessary number, are mounted on the substrate with high density, on which a phosphor film is disposed. By this hybrid structure, the excitation light emitted from all the mounted LED chips is converted into visible light by means of the phosphor film. With this structure, the mounting density of the LED chips is enhanced, while using the existing chip mounting technology. This is advantageous with a view towards easy implementation and cost-effectiveness.

In spite of these advantages, however, the hybrid structure is expected to have a problem that, since all the excitation light emitted from the LED chips will not be converted into visible light by the phosphor film, a part of the excitation light will be reflected on the resin covering the insulating substrate, to deteriorate the resin. Use of a ceramic substrate works to counter this problem. However, because of being expensive, the ceramic substrate is not suitable for this use if it requires numerous chips and so requires a large area. Other means can be also considered, such as reducing the amount of excitation light that is reflected from the phosphor film, or processing the substrate to be light resistant, in particular to be ultraviolet resistant. However, there is a limitation in preventing the excitation light from reflection. In addition, new problems are considered to arise. One example is that a heat emitted from the LED chip will be accumulated thereby deteriorating thermal-dissipation characteristic, in a case where, in an attempt to delay deterioration, a substrate is used that has a thick resin layer as a means to process the substrate to be light resistant. These problems similarly happen for the display in which numerous LED chips are disposed (in this specification, a combination of an illumination apparatus and a display is defined as "light emission apparatus").

SUMMARY OF THE INVENTION

The object of the present invention is to provide a light emission apparatus suitable for a high-intensity surface light-source, and having a reasonable structure suitable for practical use.

To solve the aforementioned problem, the light emission apparatus of the present invention includes: a substrate that dissipates heat; an insulation film that covers a main surface of the substrate; a metal wiring pattern provided on the insulation film; a light emission chip that is mounted above the insulation film, is connected to the metal wiring pattern, and emits light having a peak wavelength in a range of 250 nm to 480 nm inclusive; and a light reflective layer that is made of particles of metal oxide and is provided at any place that has the insulation film thereunder, but not light emitting surface of the light emission chip thereunder.

With the stated construction, the area of the insulation film, which is not a light emitting surface (i.e. a surface area of the insulation film which is exposed), is provided with a light reflective layer for reflecting alight that deteriorates resin. Therefore, it becomes possible to reduce the amount of light that the light emission chip irradiates through the light reflective layer towards the insulation film, thereby restricting deterioration of the insulation film. In addition, the light reflective layer is provided to cover the side surface of the light emission chip, and so the heat emitted from the light emission chip through the side surface thereof is facilitated to be dissipated towards the insulation film. Accordingly, with the surface emission type light source, too, a favorable heat dissipation characteristic is assured, thereby realizing a light emission apparatus having reasonable structure suitable for practical use.

Here, the particles of metal oxide may have an average particle diameter of 0.50 μm or below.

Usually, the excitation light emitted from the light emission chip (i.e. ultraviolet light) has a wavelength of about 0.35–0.40 μm. In light of this, if the average particle diameter of the metal oxide particles is 0.50 μm or below, it is considered that the distance between each of the two metal oxide particles tends to be 0.18–0.20 μm or below. As such, if the distance between the particles is half of the wavelength of the light or below, the light cannot pass between the particles, thereby enabling the excitation light to be reflected at the light reflective layer, for the most part.

Specific examples of the metal oxide include $Al_2O_3$ and ZnO.

In addition, if the light emission chip that emits excitation light is either a resonant light emitting diode chip or a vertical-cavity surface-emitting laser chip, then the light emitted in vertical direction from the light emission surface of the light emission chip will be directly irradiated on the phosphor layer, without dispersing, thereby improving the light emission efficiency of the light emission apparatus.

Note that a thread hole and a groove may be provided with respect to the substrate in a position where the light emission chip is provided in a plan view, the thread hole being to be used in mounting of the light emission apparatus, the groove being to absorb distortion which occurs when the substrate expands due to heat. According to this construction, if the light emission apparatus is fixed by means of screws, the chips will be prevented from falling off, as a result of the distortion of the substrate due to thermal expansion.

Here, for the light emission apparatus to be made feasible, a covering member may be provided therefor, that covers the light emission chip and is made from: a glass substrate; and a phosphor layer that is provided on a main surface of the glass substrate facing the light emission chip and that is excited by light emitted from the light emission chip thereby emitting excitation light.

Furthermore, the light emission chip may be made to abut against the phosphor layer. With such a structure, the thickness of the light emission apparatus can be made thinner, thereby realizing more compact structure therefor.

For use as an illumination apparatus, it is preferable, so as to enable emission of white light, that the phosphor layer is made of either: a material that emits white excitation light by being excited by the light emitted from the light emission chip; or a material that emits such excitation light that, when synthesized with the light from the light emitting chip, yields white light.

In addition, it is also possible to fix the covering member to the substrate as follows, instead of fixing the covering member by means of adhesives. That is, the glass substrate of the covering member is fitted into a metal frame, and the stated metal frame is fixed to the substrate by means of welding. With this construction, the fixing does not require resin, therefore resin-related deterioration will not occur.

BRIEF DESCRIPTION OF THE DRAWINGS

These and other objects, advantages and features of the invention will become apparent from the following description thereof taken in conjunction with the accompanying drawings that illustrate a specific embodiment of the invention. In the drawings:

FIG. 1A being a plan view, and FIG. 1B being an exploded slanting view;

DESCRIPTION OF THE PREFERRED EMBODIMENTS (The First Embodiment)

(1) The Entire Structure of Illumination Apparatus

Figure 1A:
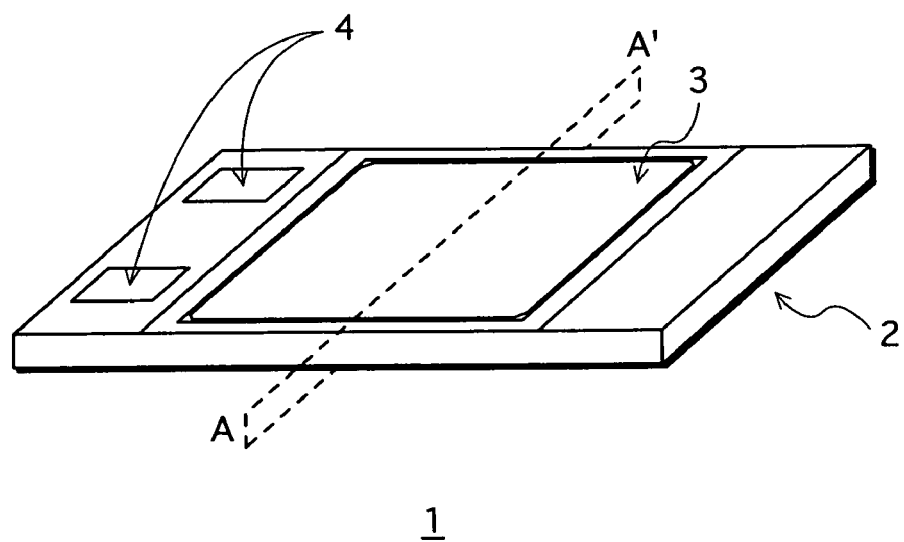
FIG. 1A and FIG. 1B are each a slanting view of the illumination apparatus that relates to the first embodiment of the present invention.
Figure 1B:
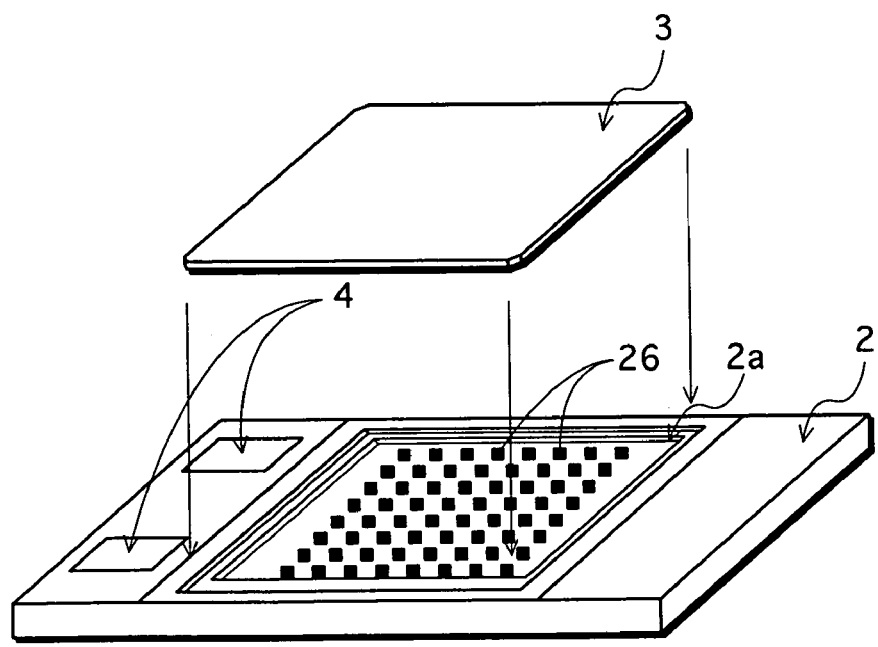

FIG. 1A is a schematic slanting view of the illumination apparatus that relates to the first embodiment of the present invention, and FIG. 1B is an exploded slanting view of the illumination apparatus.

As shown in these drawings, the illumination apparatus 1 is comprised of a substrate section 2, a cover 3, and a power-feeder 4. The substrate section 2 is flat-shaped and has a concave 2a in the middle thereof. At the bottom of the concave 2a, a plurality of chips 26 are arranged in a grid pattern. The chips 26 are hermetically sealed, by the structure in which the cover 3 that is also flat-shaped is fixed to the substrate section 2 to cover the concave 2a. Furthermore, the upper main surface of the substrate section 2 is provided with the power-feeder 4 for feeding electricity from an outside source to the chips 26.

Figure 2:
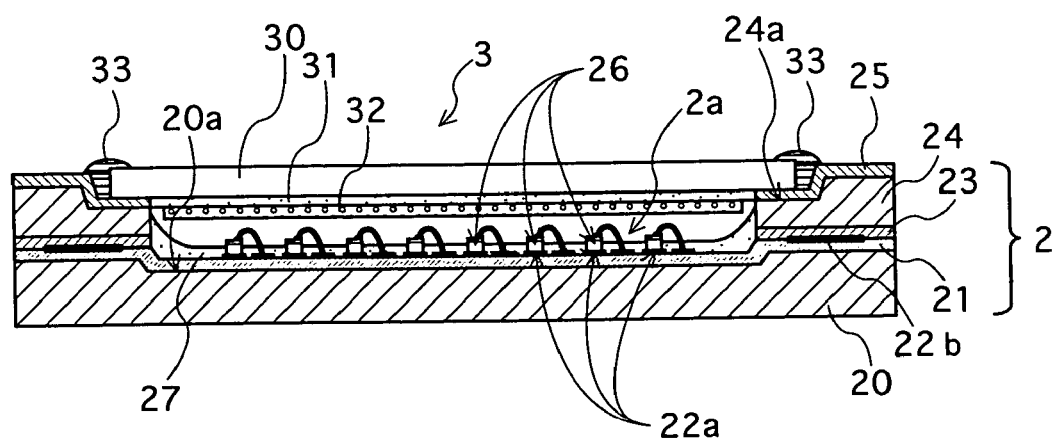
FIG. 2 is a sectional diagram of the illumination apparatus of FIG. 1A taken along the line A-A'.

FIG. 2 is a sectional view of the illumination apparatus 1 shown in FIG. 1A, which is taken along the line A-A'.

As shown in this drawing, the substrate section 2 is formed by accumulating the following: a metal substrate 20 whose center part corresponding, in position and form, to the concave 2a has a concave 20a; a resin layer 21 that covers the entire surface of the metal substrate 20; a first metal layer 22a that is placed at an area, on the resin layer 21, that corresponds to the concave 2a; and a second metal layer 22b that is placed at an area, on the resin layer 21 except where there is the concave 2a. Moreover, a resin layer 23, a metal layer 24, and a resin layer 25 are accumulated over the second metal layer 22b (i.e. at an area except where there is the concave 2a), in the stated order.

Moreover, the substrate section 2 has a plurality of chips 26 and a light reflective layer 27, in the concave 2a. The chips 26 are fixed above the resin layer 21 while being electrically conducted to the first metal layer 22a, and emit excitation light such as ultraviolet light when being fed electricity. The light reflective layer 27 is placed to cover the whole area of the concave 2a except where there are the light emitting surfaces of the chips 26, and is used for indirectly reflect the excitation light emitted from the chips 26. That is, the light reflective layer 27 reflects back the light after being reflected by the cover 3.

The metal substrate 20 is used for, by means of the resin layer 21 and the like, releasing a heat generated at the time when the chips 26 are supplied electricity to outside. For this metal substrate 20, a substrate made of metal having excellent thermal conductivity characteristic is used. One example thereof is an aluminum substrate of length 30 mm, width 20 mm, and thickness 1 mm, which will be provided, at the center, with a concave 20a whose depth is 100 µm, so as to create the concave 2a.

The resin layer 21 is a layer made of resin having both of an excellent thermal conductivity and an insulation characteristic. This resin layer 21 insulates the first metal layer 22 provided thereover, and also insulates the second metal layer 22b by laminating it with the resin layer 23. The composition of the resin layer 21 is, for example, an epoxy bromide resin. Furthermore, if 90 wt % alumina fine particles (e.g. those having average particle size of about 100 µm) are added thereto, it will improve the thermal conductivity of this resin. Then, the alumina fine particles function as a thermal conductive filler, so as to facilitate the heat emitted from the chips 26 to be conducted to the metal substrate 20. This will then improve the heat dissipating characteristic of the illumination apparatus. As the mentioned thermal conductive filler, fine particles of aluminum nitride, boron nitride, diamond, or the like, can be used. In addition, needless to say, the resin layer 21 may be replaced by an insulation thin-film layer made of a material having favorable insulation characteristic, such as ceramics.

The first metal layer 22a is provided, as a print wire, on the surface of the metal substrate 20 where there is formed the concave 20a (i.e. on one main surface of the resin layer 21, where the concave 20a faces). The first metal layer 22a is electrically conducted to the second metal layer 22b, at a part not shown in the drawing, and is for feeding electricity supplied by the second metal layer 22b, to the chip 26 fixed thereover.

Figure 3:
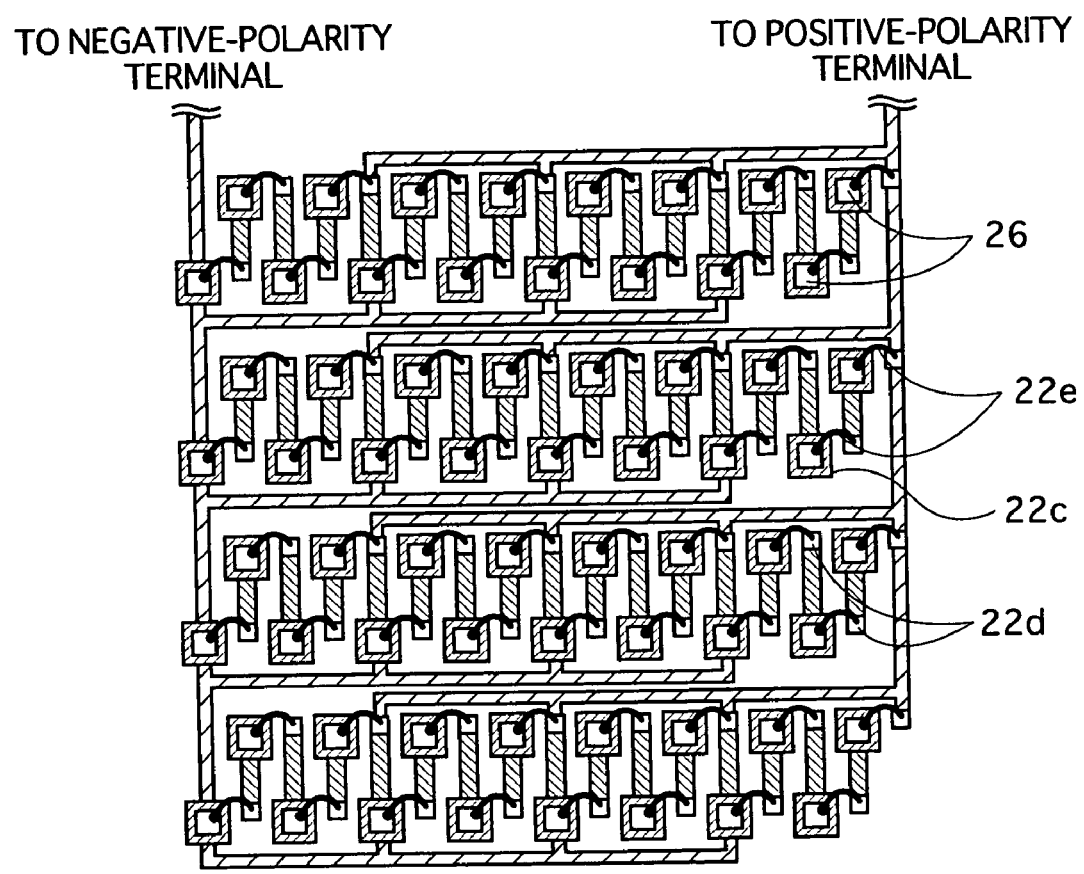
FIG. 3 is a diagram showing a wiring pattern of the first metal layer of the present invention.

FIG. 3 is a schematic plan view of the wiring pattern of the first metal layer 22a.

As shown in this drawing, the first metal layer 22a is comprised of a plurality of pairs each comprised of an element fixing part 22c and a metal wire fixing part 22d that are conducted to each other. Here, each element fixing part 22c is for securing a chip 26, and the metal wire fixing part 22d is for fixing the metal wire 22e to be mounted on the top of the chip 26. When the chips 26 are fixed to the corresponding element fixing parts 22c, the chips 26 will be connected to each other to be in a so-called "4 series 16 parallel" pattern, by means of the metal wire fixing parts 22d and the metal wires 22e. Note here that the number of elements for the pattern is not limited to such. In addition, by placing a metal layer in an area not in touch with this wiring pattern, the heat dissipation characteristic of the light-emitting apparatus will be made to be improved, thanks to the favorable thermal conductivity of the placed metal layer.

Now turning back to FIG. 2, the second metal layers 22b are respectively formed by a conductive metal such as a copper foil, and are, at parts not shown in the drawing, electrically conducted to the respective ends of the power-feeder 4 (FIG. 1). The second metal layers 22b feed the electricity fed from an external source to the first metal layer 22a.

The resin layers 23 each cover the second metal layers 22b made of copper foil, to insulate them from the metal layer 24, and are composed of an epoxy bromide resin and the like, which is the same composition as the resin layer 21.

The metal layer 24 is made of an aluminum substrate, just as the metal substrate 20, and has a function of releasing to outside the heat transmitted via the second metal layers 22b and via the resin layer 23. Note that the concave 2a is provided, at the side surface thereof, with a step part 24a so as to facilitate inserting of the cover 3.

The chips are VCSEL chips on which a plurality of vertical-cavity surface-emitting laser elements (VCSEL element) are mounted. Each VCSEL element emits excitation light from the top thereof which works as a light emitting surface. Here, the excitation light has a peak wavelength of 350 nm. Each chip 26 will be fixed to the respective element fixing part 22c of the first metal layer 22a. Note here that for the chips 26, elements whose excitation light has a peak wavelength of 250–480 nm may be used. Taking into account the excitation by means of phosphor, more desirable peak wavelength is 250–410 nm, and preferably in the range of 340–410 nm. The excitation light from the VCSEL elements of each chip 26 will be directed to the cover 3. However part of the excitation light will return after reflected by the cover 3. Therefore, a light reflective layer 27 made of alumina ($Al_2O_3$) particles is filled where the chips 26 are, so as to cover the side surfaces of the chips 26, and also to cover the entire bottom surface of the concave 2a (more specifically, all the surface of the resin layer 21 except where the chips 26 reside). Here, for the light reflective layer 27, not only the alumina particles but also particles made of any one, or combination of at least two, of the following may be used: $ZnO$, $Y_2O_3$, $TiO_2$, $ZrO_2$, $HfO_2$, $SiO_2$, $SnO_2$, $Ta_2O_5$, $Nb_2O_5$, $BaSO_4$, $ZnS$, and $V_2O_5$. In addition, as for the material for the light reflective layer 27, the same material used for the phosphor layer 32 may be alternatively used. In this case, the light reflective layer 27 will have a light-emitting capability, as well as the capability of reflecting light. So as to make full use of the light-emitting capability, it is desirable to make average particle diameter for the material to be in a range of 0.10–0.50 µm. Furthermore, in terms of favorable heat-reflecting/heat-dissipating efficiencies, the average particle diameter should be desirably 10–100 nm, and it is particularly preferable to have the average particle diameter around 50 nm.

The cover 3 has a structure in which the glass substrate 30, the light reflective layer 31, and the phosphor layer 32, are accumulated in the stated order, and that the phosphor layer 32 is fixed, at its circumference, by an ultraviolet-light hardening resin 33, while being directed to the substrate section 2 and made to abut against the resin layer 25 which is on the step part 24a of the substrate section 2. Note that when fixing the cover 3, the space between the concave 2a of the substrate 2 is replaced with an inactive gas such as nitrogen.

The glass substrate 30 is in plate-form which is made of borosilicate glass.

The light reflective layer 31 (a thickness of 300 nm) is a layer filled with alumina particles, and is capable of reflecting the excitation light having passed through the phosphor layer 32. Thanks to this capability, the light reflective layer 31 can reflect back the excitation light having passed through, towards the phosphor layer 32, thereby improving efficiency in converting the excitation light into white light, and also preventing the excitation light from being released to outside. Note that because of being very thin, the light reflective layer 31 will not affect the reflection of white light that is from the phosphor layer 32. In addition, the other materials, different from the alumina particles, that are applicable to the light reflective layer 27, may be equally used for the light reflective layer 31.

The phosphor layer 32 is created as follows. First, phosphor particles that emit three primary colors by means of excitation light (ultraviolet light) are mixed at an adequate ratio, so that the phosphor layer 32 can emit white during light emission (the primary colors being specifically: red (such as $La_2O_3S:Eu^{3+}$), green (such as $(Sr,Ba)_2SiO_4:Eu^{2+}$), blue (such as $(Ba,Sr)MgAl_{10}O_{17}$: $Eu^{2+}$). Then, an adhesive agent such as phosphor oxide and boron oxide, and a thickener such as ethylecellerose are mixed into a medium such as tapineole, thereby obtaining a phosphor paste. This phosphor paste is finally applied as a layer-form and then fired.

The power-feeder 4 (FIG. 1) is a power-feeding terminal comprised of a pair of positive/negative ends. In the area we cannot see from the drawing, each end of the power-feeder 4 is electrically conducted to the corresponding second metal layer.

With the stated structure, when the illumination apparatus is driven, the excitation light emitted from the chips 26 will be irradiated on the phosphor layer 32 of the cover 3, thereby emitting white light. The emitted white light will then be irradiated outside, after passing through the glass substrate 30.

(2) With Regard to the Chips 26

Next, the wiring for the chips 26, the structure thereof, and the like are explained.

Figure 4:
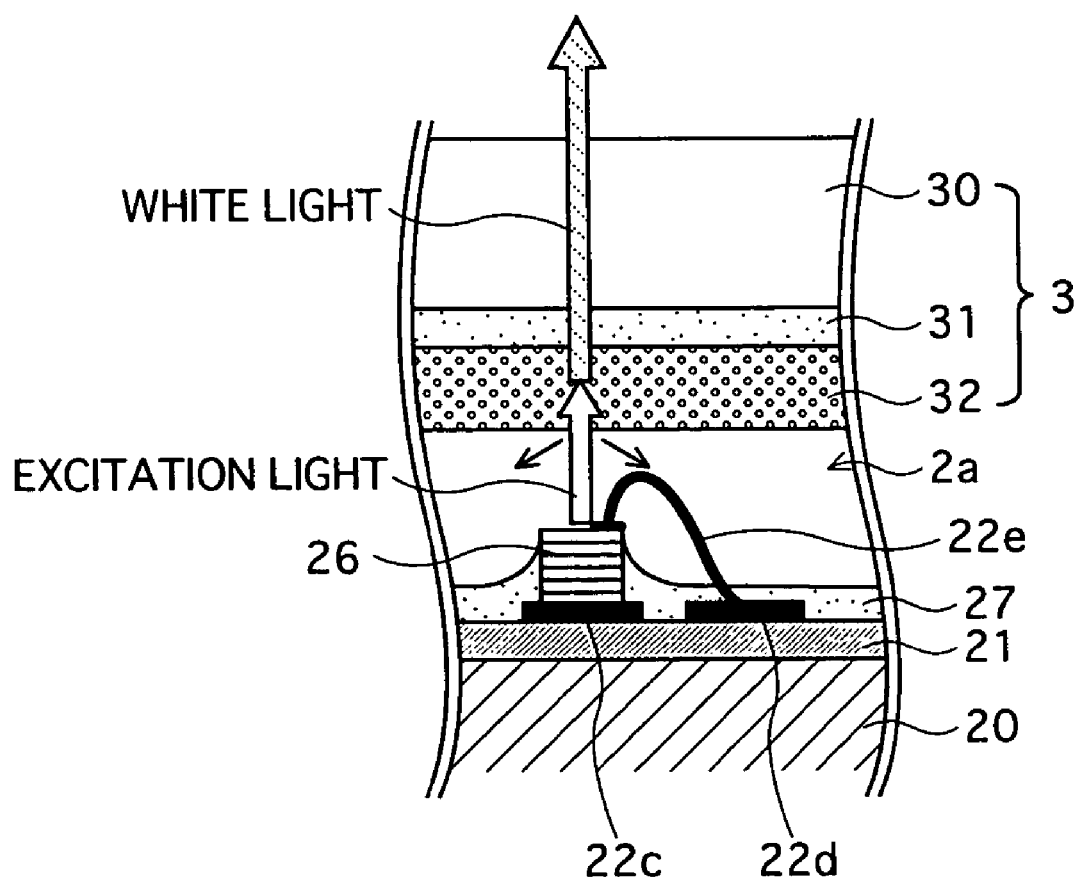
FIG. 4 is a partly enlarged view of the vicinity of the chip shown in FIG. 2.
Figure 5:
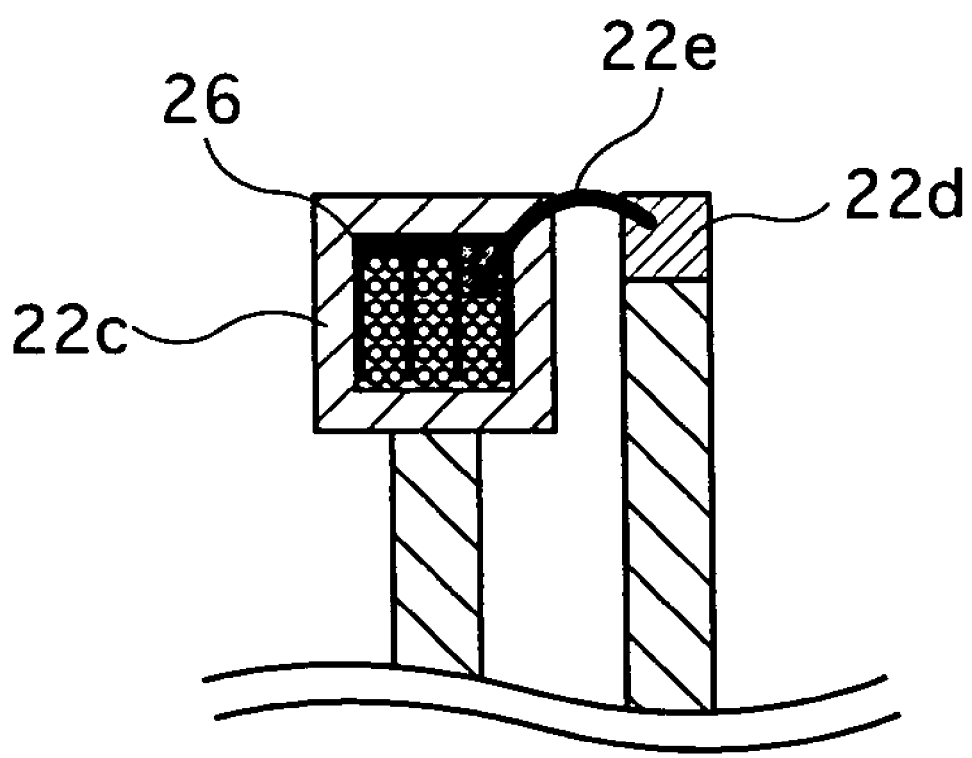
FIG. 5 is a partly enlarged view of the vicinity of the chip shown in FIG. 3.

FIG. 4 is an enlarged view of the vicinity of one chip 26 depicted in FIG. 2. FIG. 5 is a schematic plan view of the vicinity of one chip 26, without the cover 3.

As shown in these drawings, one chip 26 is fixed over an element fixing part 22c, in an electrically conducted condition thereto. A metal wire 22e is attached at one end to the top part of the chip 26, and the other end thereof is attached to a metal wire fixing part 22d adjacent thereto.

Figure 6:
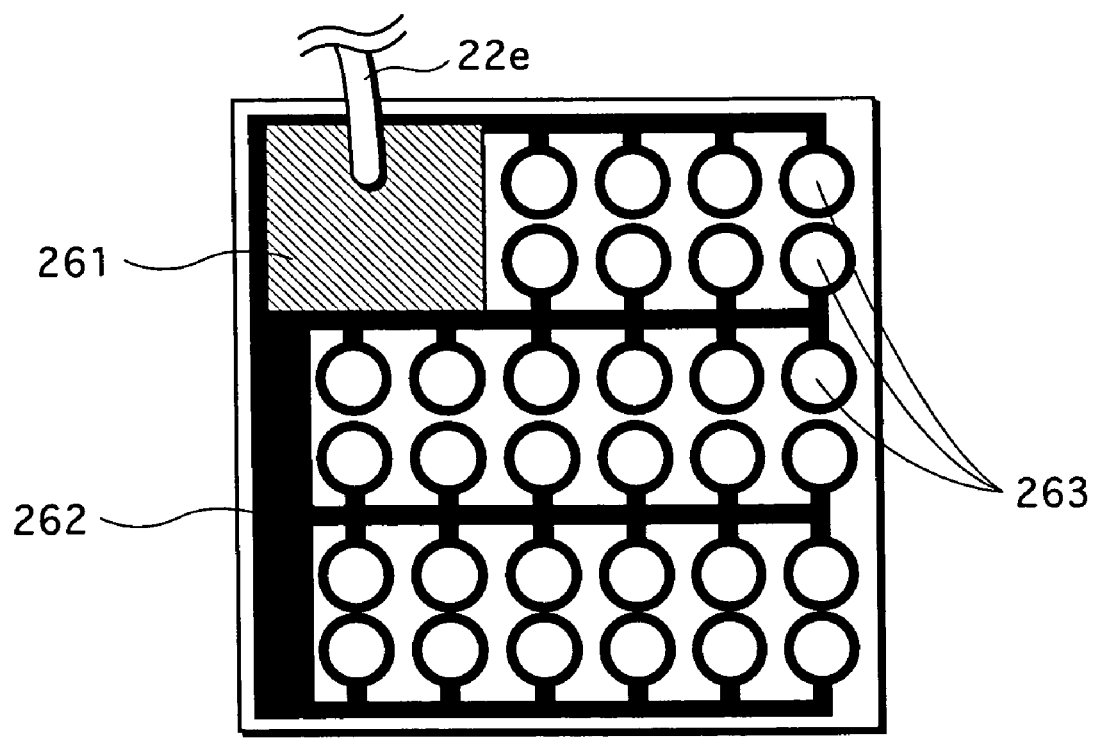
FIG. 6 is a plan view of the chip.

FIG. 6 is an enlarged plan view of the chip 26.

As shown in this drawing, the top part of a chip 26 is comprised of: an anode electrode 261 to which the metal wire 22e is connected, the wiring section 262 branched from the anode electrode 261, and 32 VCSEL elements 263 which is electrically parallel-connected to the top of the branches of the wiring section 262. Note that the VCSEL elements 263 of the chips 26 are formed by etching, which enables to form a plurality of elements to be formed on one substrate at once. The etching method will be detailed later. Note here that the number of VCSEL elements 263 on one chip is not limited to such.

Here, the structure of VCSEL element 263 is described.

Figure 7:
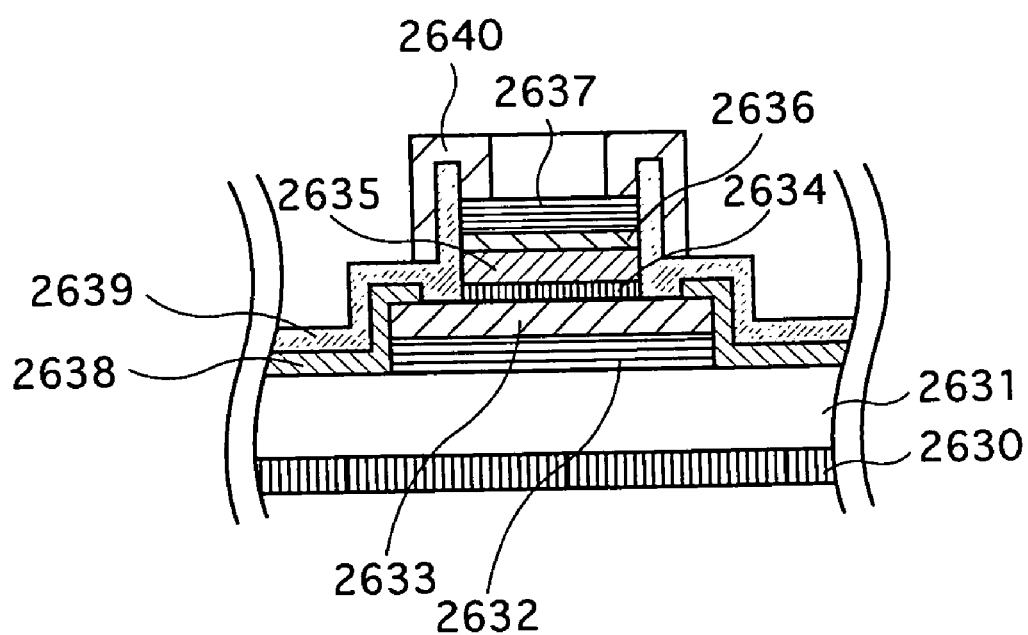
FIG. 7 is a sectional view of the element.

FIG. 7 is a sectional view of VCSEL element 263 of a chip 26.

As shown in this drawing, VCSEL element 263 of the chip 26 has a structure that a plurality of cylinders having hollow at center are accumulated. More specifically, from the bottom, a cathode electrode 2630, an n-AlGaN substrate 2631 are accumulated in this order. Then over them, a semiconductor DBR layer 2632 made from 60 layers of AlGaN(Al>30%)/GaN) that are in round form in plan view, and an n-Clad layer 2633 which is made of n-AlGaN (Al<10%) are placed. Then over them, furthermore, an MQW layer 2634, and a p-clad layer 2635 which is made of p-AlGaN (Al<10%), and a p-GaN contact layer (not shown in the drawing), an ITO layer 2636, and a dielectric DBR layer 2637 are accumulated in this order. Here, the MQW layer 2634 is made of 5 accumulated layers that are made of AlGaN(Al=15%)/AlGaN(Al=3%) and that have smaller diameter than the layers thereunder; and the dielectric DBR layer 2637 is made of 20 accumulated layers that are made of $Ta_2O_5/SiO_2$. From the upper surface of the n-AlGaN substrate 2631 to the side surfaces of the semiconductor DBR layer 2632 and of the n-Clad layer 2633, an Al bridge wire 2638 is provided so as to facilitate the flow of the electric current. In addition, an SiN passivation film 2639 is applied on the side surfaces of from the MQW layer 2634, the p-clad layer 2635, the p-GaN contact layer (not shown), the ITO layer 2636, to the dielectric DBR layer 2637, and further on the Al bridge wire 2638. Furthermore, on part of the SiN passivation film 2639 and of the dielectric DBR layer 2637, an anode electrode 2640 coated with Ti/Pt/Au by evaporation is formed.

When the VCSEL element 263 is driven, an excitation light is emitted, in a vertical direction, from the light-emitting surface of the dielectric DBR layer 2637, around which the anode electrode 2640 surrounds.

The VCSEL element 263 at this chip 26 is characterized in that it has smaller dimension in which the light disperses from the source, and so is excellent in straightness with which the emitted light travels.

For a conventional LED element, the emitted light therefrom, when going from the LED element being high-reflective to the air being low-reflective, reflects back on the LED element itself, because of the critical angle related issue, thereby making it difficult to take out the light from the LED element. Conventional ways to alleviate the occurrence of the aforementioned problem of reflected light is to mold LED elements with resin being more refractive than the air.

However, the present embodiment, by the use of VCSEL element 263 being excellent in straightness with which its emitted light travels, prevents the problem of critical angle from happening, and so it is no more necessary to mold the element with resin. Therefore, the present embodiment, just as conventionally, can alleviate the problem of resin deterioration which would be caused by the excitation light emitted from the element itself. Furthermore, it is also possible to use resonant light emitting diode (RC-LED chip) as the chips 26. The RC-LED chip is inferior to the VCSEL element, in straightness with which the emitted light therefrom travels; however is still superior to the conventional LED elements in that feature. Further, chips made of conventional LED element may still be used although it probably will reduce the intensity of the light-emitting apparatus.

The excitation light emitted from the chips 26 equipped with this VCSEL element 263 will be irradiated on the phosphor layer 32 of the cover 3, as shown in FIG. 4. Then, the phosphor layer 32, excited thereby, will emit white light. This white light then passes through the light reflective layer 31 and through the glass substrate 30, to be finally irradiated outside.

However, not all the excitation light irradiated on the phosphor layer 32 will be converted into white light; some part thereof will pass through the phosphor layer 32, and another part thereof will be reflected back by the phosphor layer 32. The part of the excitation light that has passed thorough the phosphor layer 32 will be reflected back by the light reflective layer 32 provided in the light's traveling direction, so as to be converted into white light. On the other hand, the excitation light reflected by the phosphor layer 32 will be irradiated towards the resin layer 21 where the chips 26 are provided.

Here, since the upper surface of the resin layer 21 is coated with the light reflective layer 27, by which the excitation light will again be reflected towards the phosphor layer 32. This prevents the excitation light from reaching the resin layer 21, thereby restricting the deterioration of resin. Here, the average particle diameter of the metal oxide particles used for the light reflective layer 27 is preferably 0.50 μm or smaller. This is because a normal material for the chips 26 has a peak wavelength of 0.25 μm–0.48 μm (i.e. 250–480 nm), therefore it is easy for the interval between the particles therein to be 0.18 μm or below, by making the average particle diameter of the metal oxide particles of the light reflective layer 27 to be 0.50 μm. Note that preferably the average particle diameter of the metal oxide particles of the light reflective layer 27 should be as small as possible, so as to facilitate light reflection and to improve filling factor thereby improving thermal conductivity and further improving heat-dissipation characteristic. It is particularly preferable that the average particle diameter therefor is around 50 nm. As seen in the above, if the interval between the metal oxide particles coincides with the wavelength of the excitation light or below, the excitation light will be prevented from passing the space created between the metal oxide particles, and so the light reflective layer 27 can assuredly reflect the excitation light.

Furthermore, since the light reflective layer 27 covers the side surfaces of the chips 26, the heat from the chips 26 can be quickly dissipated towards the resin layer 21, thereby improving the heat dissipating efficiency of the chips 26. Please note here that in FIG. 4, near the chip 26, the light reflective layer 27 gains in thickness so as to entirely cover the side surface of the chip 26.

In addition, since the glass substrate 30 of the cover 3 is glass, deterioration in relation to the excitation light will not happen.

(3) The Production Method of the Illumination Apparatus

<the Production Method of the Substrate Section 2>

First, a metal substrate 20 is formed by creating a concave 20a having depth of 100 μm at the center of an aluminum substrate by debossing, where the aluminum substrate has length of 30 mm, width of 20 mm, and thickness of 1 mm (FIG. 2). Then, on the surface of the metal substrate 20 which has been provided with this concave 20a, a resin sheet and a transferring sheet are accumulated in this order, the resin sheet being made of epoxy bromide and having thickness of 100 μm, and the transferring sheet being on which a copper film having thickness of 25 μm is patterned for the purpose of creating the first metal layer 22a and the second metal layer 22b. Then, by thermocompression bonding, thus generated copper-film pattern is transferred to the resin sheet. Further, to the areas excluding the concave 20a, the following are accumulated in this order: a resin sheet made of epoxy bromide having thickness of 100 μm, so as to form the resin layer 23; an aluminum substrate having thickness of 1 mm formed by debossing, so as to form the metal layer 24; and a resin sheet made of epoxy bromide and having thickness of 100 μm, so as to form the resin layer 25. After this, these are subjected to the thermocompression bonding.

Next, the VCSEL element 263 for the purpose of creating the chip 26 is attached to the aforementioned first metal layer 22a.

As follows, the production method of this VCSEL element 263 is explained.

FIGS. 8A–8C, FIGS. 9A–9C are sectional view of each production process for the VCSEL element 263.

Figure 8A:
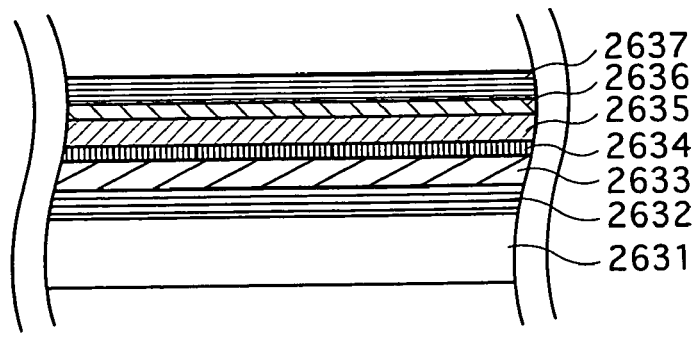
FIG. 8A–FIG. 8C are each sectional view of the element, during each production process of the present invention.

As shown in FIG. 8A, firstly, a semiconductor DBR layer 2632 which is made of 60 layers of AlGaN(Al>30%)/GaN is applied on the n-type AlGaN substrate 2631, by means of MOCVD.

Next, an n-AlGaN(Al<10%) clad layer 2633, and an MQW layer 2634 which is made of five layers of AlGaN (Al=15%)/AlGaN(Al=13%) are accumulated.

Then, a p-AlGaN(Al<10%) clad layer 2635 and a p-GaN contact layer (not shown) are accumulated thereto, in this order.

Then, using the accumulation-layer spatter apparatus, an ITO layer 2636, and a dielectric layer 2637 are accumulated, the dielectric layer 2637 being accumulation of 20 layers of $Ta_2O_5/SiO_2$.

Figure 8B:
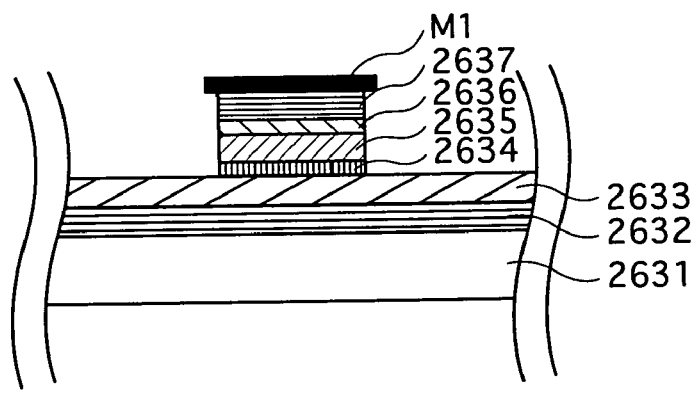

Next, as shown in FIG. 8B, the section of the VCSEL element that corresponds to the diameter of 20μ is masked by a mask M1, and then etching is performed thereto. Then, the other parts of the VCSEL element are removed. By the aforementioned operations, the layers situating higher than the n-AlGaN(Al<10%) are removed.

Then, masking is performed for the section corresponding to a larger diameter than the mask M1, with use of a mask M2, so as to perform etching up to the n-type AlGaN substrate 2631.

Figure 8C:
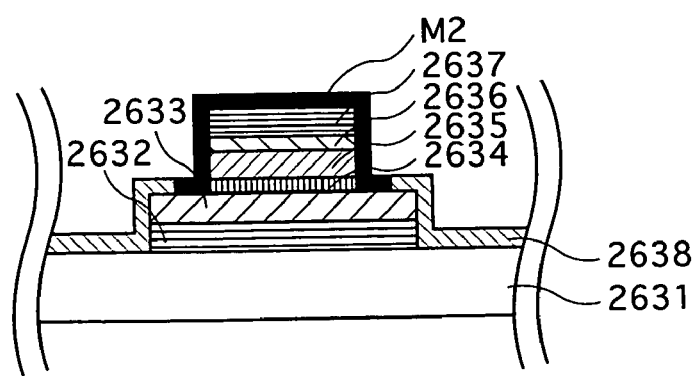

By the aforementioned operations, a step part will be formed as shown in FIG. 8C, and to the step part, an Al bridge wire 2638 is provided, so as to facilitate the electric current running from the n-type AlGaN substrate 2631 to then-Clad layer 2633.

Figure 9A:
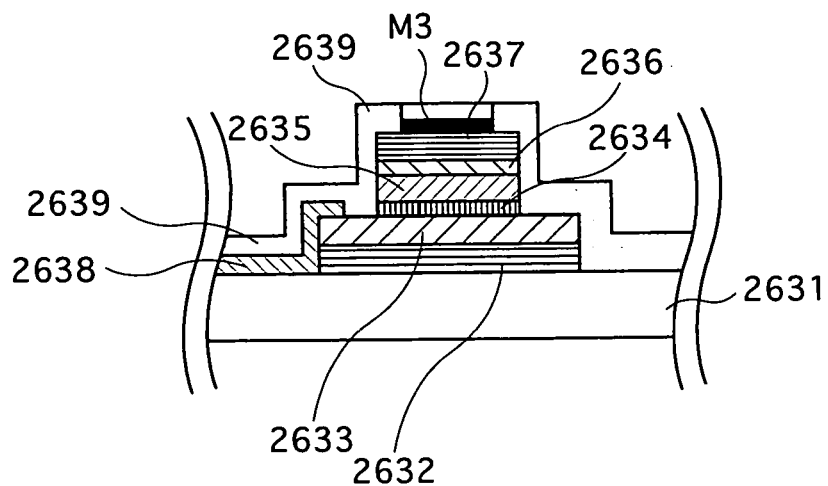
FIG. 9A–FIG. 9C are each sectional view of the element, during each production process of the present invention.

Then, after the mask M2 is removed, apart of the dielectric DBR layer 2637 is once again masked with use of a mask M3, as shown in FIG. 9A, then an SiN passivation film 2639 is coated to protect the surface of the VCSEL element.

Figure 9B:
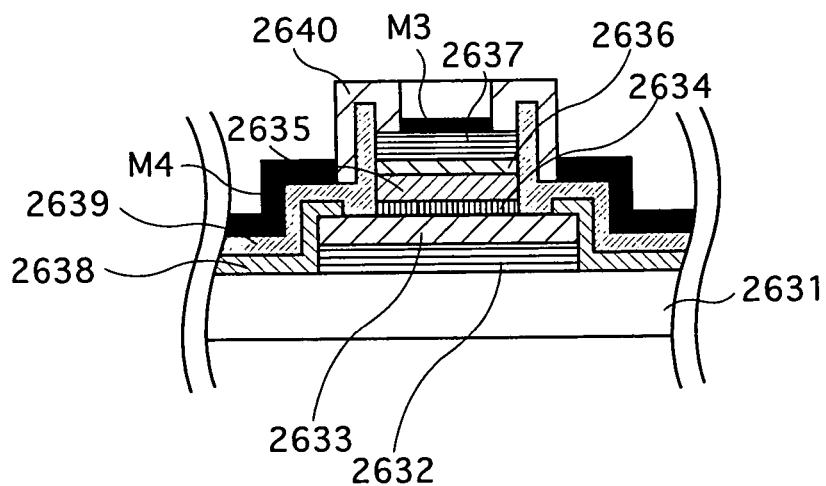
Figure 9C:
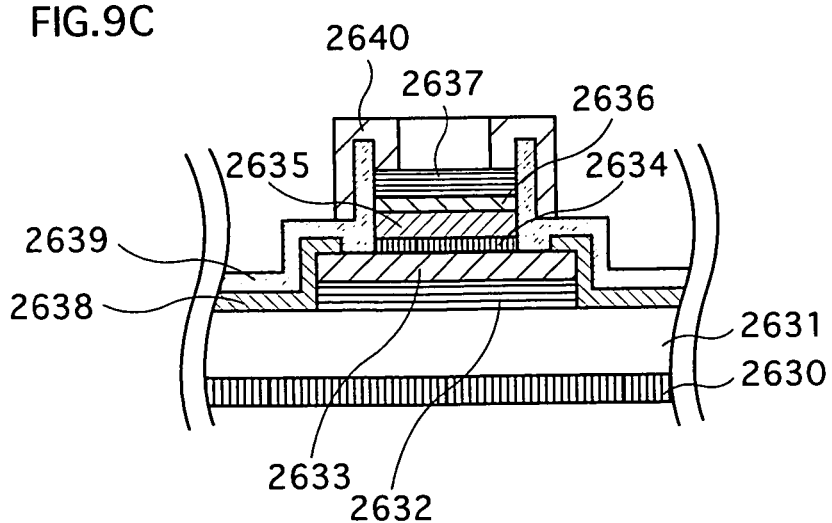

As shown in FIG. 9B, the SiN passivation film 2639 is removed which situates over the dielectric DBR layer 2637, and then a mask M4 is used to perform masking so as to make an anode electrode. Then, evaporation method is used to cover the anode electrode made of Ti/Pt/Au.

Finally, after removing the masks M3 and M4, at the back of the n-type AlGaN substrate 2631, Ni/Au is coated by evaporation method, thereby forming a cathode electrode 2630. After this, each VCSEL chip is separated from one another. By the series of operation, each VCSEL chip (350 by 350 μm square) is formed on which 32 VCSEL elements 263 are mounted.

Thus formed chip 26 is then fixed to the element fixing part 22c of the first metal layer 22a (see FIG. 3) which is provided over the concave 20a of the metal substrate 20 (of FIG. 2). This fixing is performed by first forming four gold bumps for each of the element fixing parts 22c, and then by pressing thereto the gold bump. By this, the gold bumps will spread over the lower surface of the chip 26. At the time of driving, the heat generated at the chip 26 is rapidly dissipated to the metal substrate 20. Then, the top part of the chip 26 that has been fixed and the metal wire fixing part 22d are attached using the gold wire 22e (such as gold and aluminum). As the attaching method, gold eutectic soldering attaching method, and silver paste attaching method may be used, too.

Next, to the concave 2a on which the chip 26 are provided in the above way, alumina slurry is potted. The solvent included in this slurry is evaporated, so as to form the light-reflective layer 27 made of alumina particles having average particle diameter of 50 nm, to cover the side surface of the chip 26. Here, the surface tension of this solvent causes the alumina slurry covering the side surface of the chip 26 to smoothly run down from the top part of the chip 26. Thanks to this, heat is conducted efficiently from the side surface of the chip 26 to the resin layer 21. Note here that if aqueous solvent is used instead of alumina slurry, prior to filling of the aqueous solvent, inside of the concave 2a can be subjected to plasma ion bombardment, so that plus electric charge will be accumulated at the inside surface of the concave 2a to improve hydrophilicity thereof. This makes it possible to improve the wettability of the alumina slurry, and further to fill the alumina slurry evenly throughout the inner surface of the concave 2a, and the side surface of the chip 26, thereby improving the thermal dissipation from the chip 26. In addition, note that the method of subjecting the inside of the concave 2a to alkaline processing is effective, as a technique for improving wettability of the alumina slurry.

<Production of Cover 3>

Next, the production of the cover 3 is described.

First, a glass substrate 30 of 16 by 16 mm square, and having a thickness of 0.3 mm is prepared.

Figure 10A:
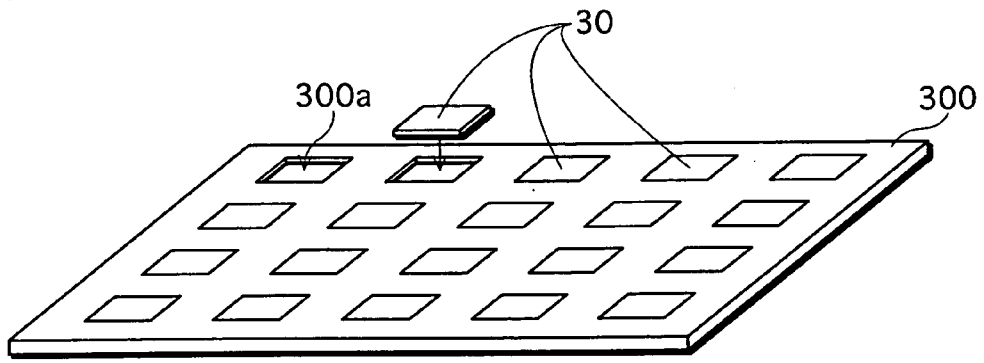
FIG. 10A–FIG. 10D show each of the cover production processes.

Then, as shown in FIG. 10A, this glass substrate 30 is inserted in the concave 300a which is provided for the glass substrate holder 300 and corresponds to the glass substrate 30, in shape.

Figure 10B:
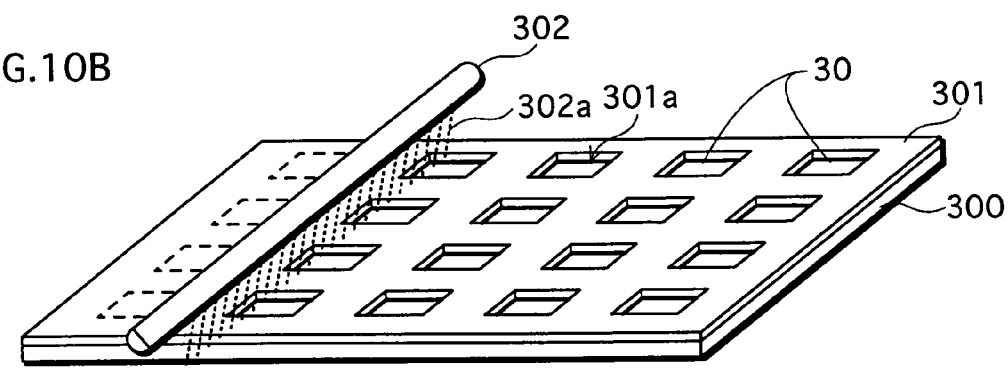

Next, as shown in FIG. 10B, a mask plate 301 made of stainless and having thickness of 50μ is mounted on the substrate holder 300. The mask plate 301 has openings 301a that are smaller than each glass substrate 30, and so can cover the edge of each glass substrate 30. Then, the alumina slurry including the alumina particles having average particle diameter of about 50 nm is sprayed to the mask plate 301, with use of a nozzle 302, then is dried.

Figure 10C:
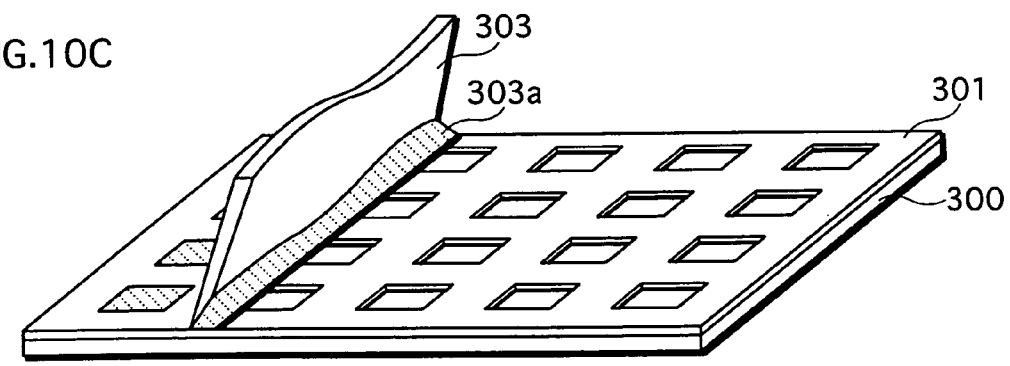

After this, as shown in FIG. 10C, a phosphor paste 303a is applied thereto, with use of a squeezee 303, and the mask plate 301 is removed. After drying the phosphor paste 303a, the phosphor is hardened and fastened, in a furnace in which the air atmosphere has temperature of about 550° C.

Figure 10D:
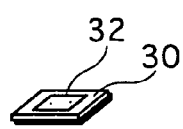

By the aforementioned operation, as shown in FIG. 10D, the cover 3 is formed on a glass substrate 30, having a light reflective layer 31 and a phosphor layer 32 thereover.

The cover 3 generated in this way is inserted to the corresponding concaves 2a of the substrate section 2, so that the side on which the phosphor layers 32 are formed faces the substrate section 2. Then, with use of the ultraviolet hardening resin 33, or of a heat hardening resin, the edges thereof are secured. This operation is desirably performed under a nitrogen atmosphere, for example, so as to make the concave 2a be sealed in the nitrogen purged condition.

(4) Mounting of the Illumination Apparatus

Figure 11A:
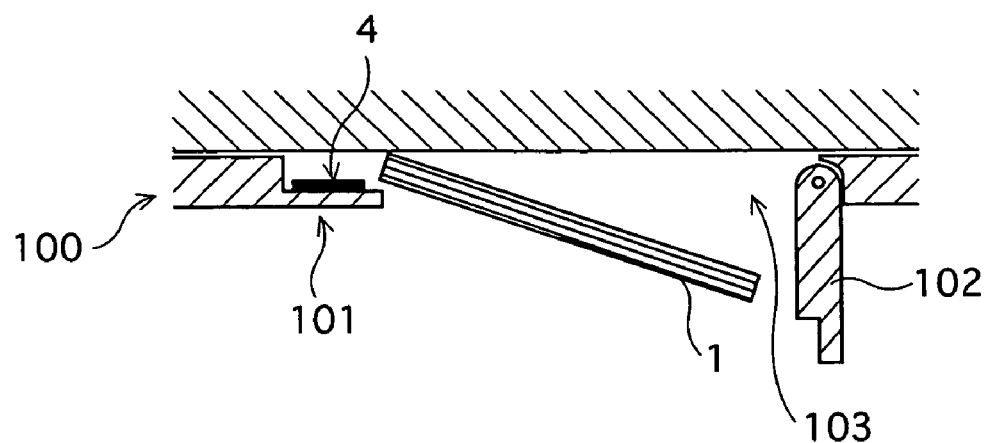
FIG. 11A–FIG. 11C describes side-surface views of the illumination apparatus, for the purpose of showing the mounting condition of the illumination apparatus relating to the present invention.
Figure 11B:
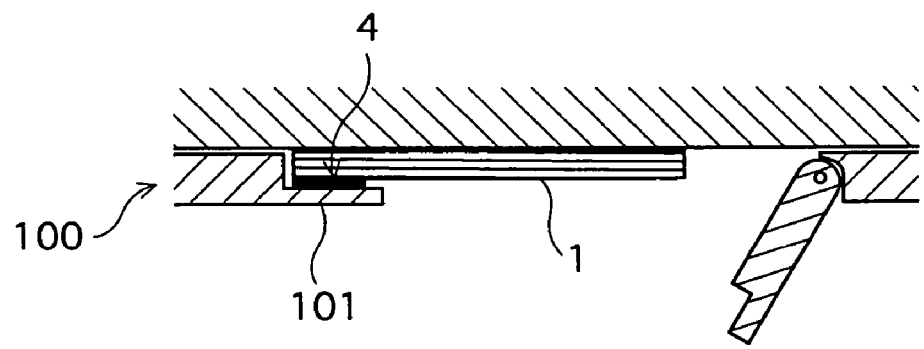
Figure 11C:
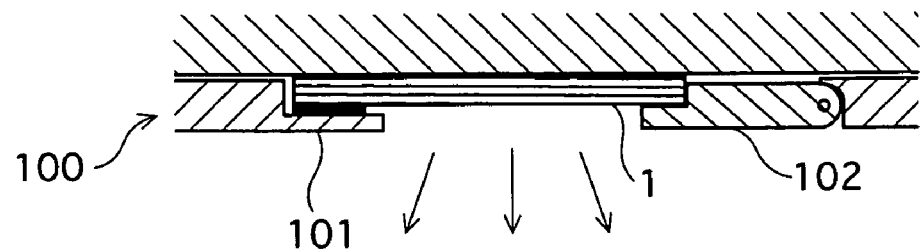

FIGS. 11A–11C are sectional diagrams of an illumination appliance in which the illumination apparatus 1 created in the above way is fixed to the holder 100.

As shown in these drawings, the illumination appliance is comprised of the illumination apparatus 1 and the holder 100 for holding the illumination apparatus 1.

The holder 100 is equipped with a latch part 101 that fixes an end of the illumination apparatus 1, and a revolvable latch part 102 capable of holding the other end of the illumination apparatus 1, by latching. Between the latch part 101 and the latch part 102, a concave 103 is formed so that the illumination apparatus 1 can be inserted to be secured. Power-feeding terminals are formed at parts of the latch part 101 that are to be in contact with the ends of the power-feeder 4 of the illumination apparatus 1 (the power-feeding terminals are not shown).

In order to fix the illumination apparatus 1 to the holder 100, firstly, the illumination apparatus 1 is inserted to the concave 103, as shown in FIG. 11A.

Next, as shown in FIG. 11B, the illumination apparatus 1 is fixed, in a condition that the end of the illumination apparatus where there is the power-feeder 4 is in contact with the latch part 101.

Next, by revolving the latch part 102 to abut against the other end of the illumination apparatus 1, the illumination apparatus 1 is held to be fixed.

According to this structure, the illumination apparatus 1 is supplied power through the power-feeder 4. Therefore, at the time of driving, the illumination apparatus 1 emits white light in a direction shown by the arrow signs of FIG. 11C, so as to function as an illumination appliance.

(5) Modification Example

In the aforementioned embodiment, the illumination apparatus is fixed to the holder by a latching structure. However, the illumination apparatus may alternatively be fixed by a screw structure.

Figure 12A:
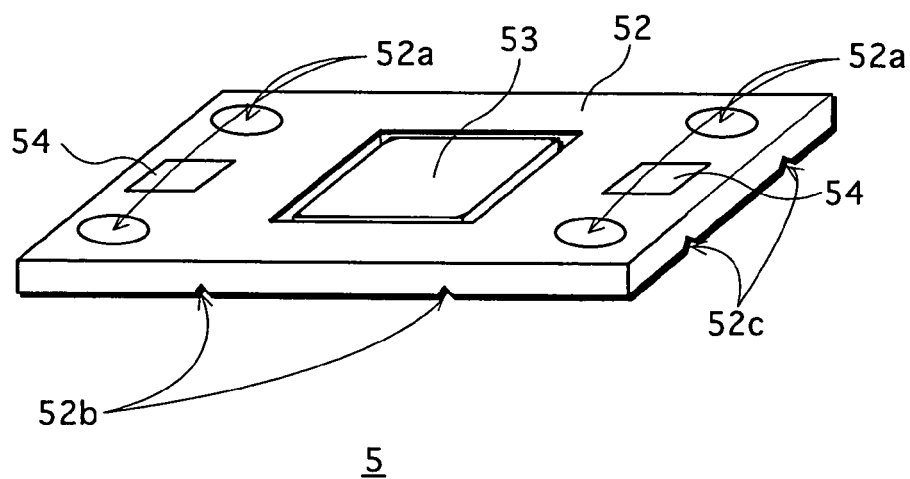
FIG. 12A is backside view and FIG. 12B is a slanting view, of the illumination apparatus relating to the modification example of the present invention.
Figure 12B:
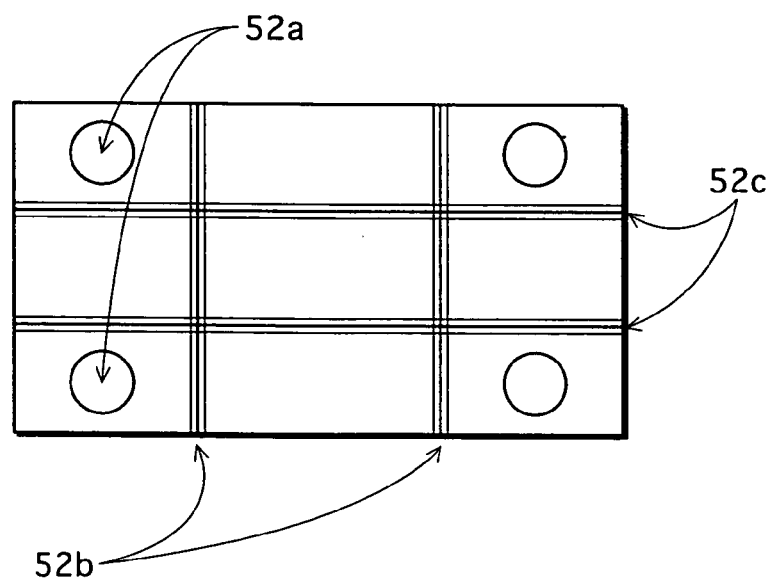

FIG. 12A is a slanting view of an illumination apparatus 5, and FIG. 12B is an underside view of the illumination apparatus 5.

As shown in these drawings, to a substrate section 52 of the illumination apparatus 5, four threaded holes 52a are drilled at four corners of the substrate section 52 of the illumination apparatus 5, in a thickness direction thereof. In addition, on the main surface of the substrate section 52, to which a cover 53 is to be mounted, power-feeder 54 is provided so that each end thereof situates between each two of the threaded holes 52a. According to the mentioned structure, the illumination apparatus 5 is secured, with use of the threaded holes 52a and screws unshown in the corresponding drawing.

Furthermore, as shown in FIG. 12B, at the underside of the substrate section 52, at areas where there will not be in contact with the cover 53 in a plan view of this substrate section 52, two grooves 52b, and two grooves 52c, all of which are v-shaped in a sectional view, are provided, so that the grooves 52b and the grooves 52c intersects at right angles. Generally speaking, when the chips which are the light source emit light, the substrate section will expand in both of the length and width directions, due to the thermal expansion. Therefore, if the illumination apparatus 5 is fixed by a screw structure, such as in this modification example, the power generated by the expansion of the substrate section 52 will be assembled in the central area of the substrate section 52, where the chips are provided, and so it is possible that the substrate 52 will be distorted. If the substrate section 52 is distorted in this way, it is further possible that the chips fall off from the substrate section 52. However, in this modification example, the V-shaped grooves 52b and 52c are provided. Therefore, the power due to the distortion can be assembled to these grooves, so as to absorb the distortion. In addition, the parts of the substrate section 52 where there are v-shaped grooves 52b, and 52c are not where the cover 53 is in a plan view of the substrate section 52. Therefore, the mentioned power will not be assembled to the area where the cover 53 is (i.e. where the chips are), thereby preventing the falling off of these chips.

(The Second Embodiment)

The only difference between the illumination apparatus of the second embodiment and the illumination apparatus of the aforementioned first embodiment lies mainly in mounting method of the cover. Therefore, the same structure as the first embodiment will not be explained in this embodiment.

Figure 13A:
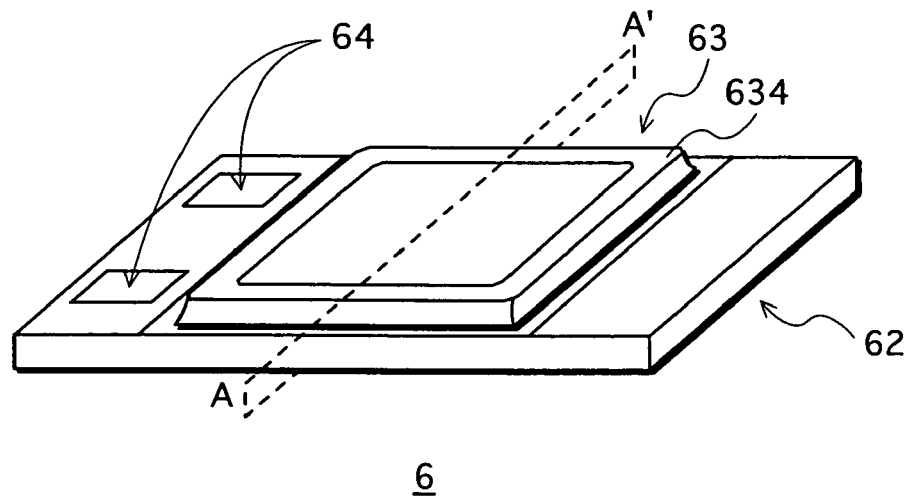
FIG. 13 is slanting view and exploded view of the illumination apparatus of the second embodiment of the present invention.
Figure 13B:
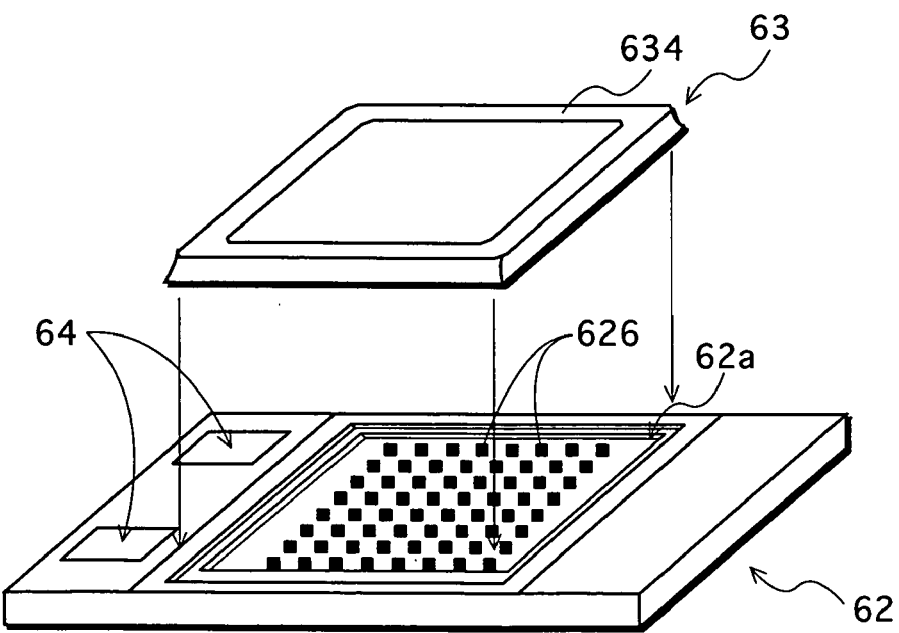

FIG. 13A is a slanting view of an illumination apparatus 6 that relates to the second embodiment; and FIG. 13B is a slanting view of the illumination apparatus 6, from which a cover 63 has been removed.

As shown in these drawings, the illumination apparatus 6 has a substrate section 62, the cover 63, and a power-feeder 64. Just as in the first embodiment, on one main surface of the substrate section 62, a concave 62a is provided, for which chips 626 are provided. The cover 63 is fixed, in a sealed condition, to the opening of the concave 62a, so as to cover the chips 626.

Figure 14:
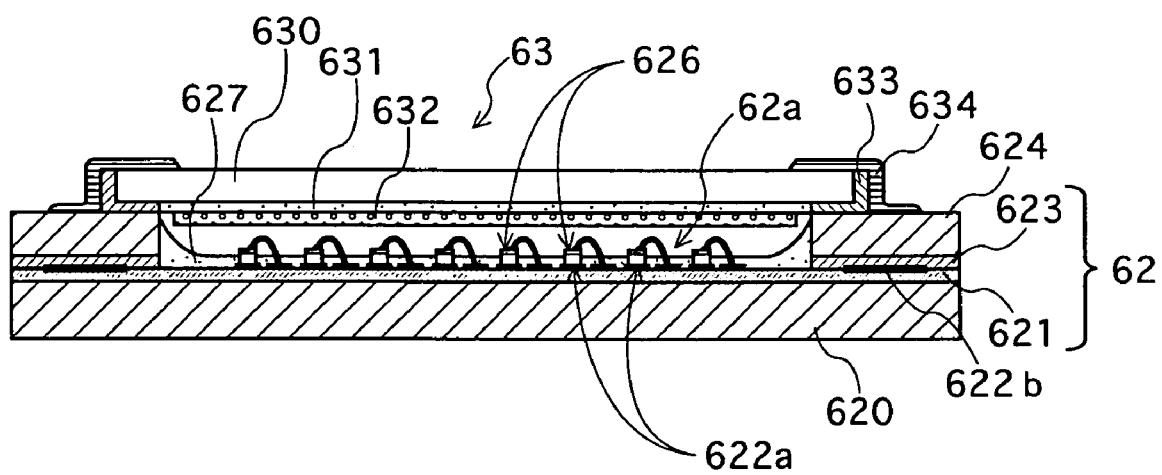
FIG. 14 is a sectional view of the illumination apparatus relating to the second embodiment of the present invention.
Figure 15:
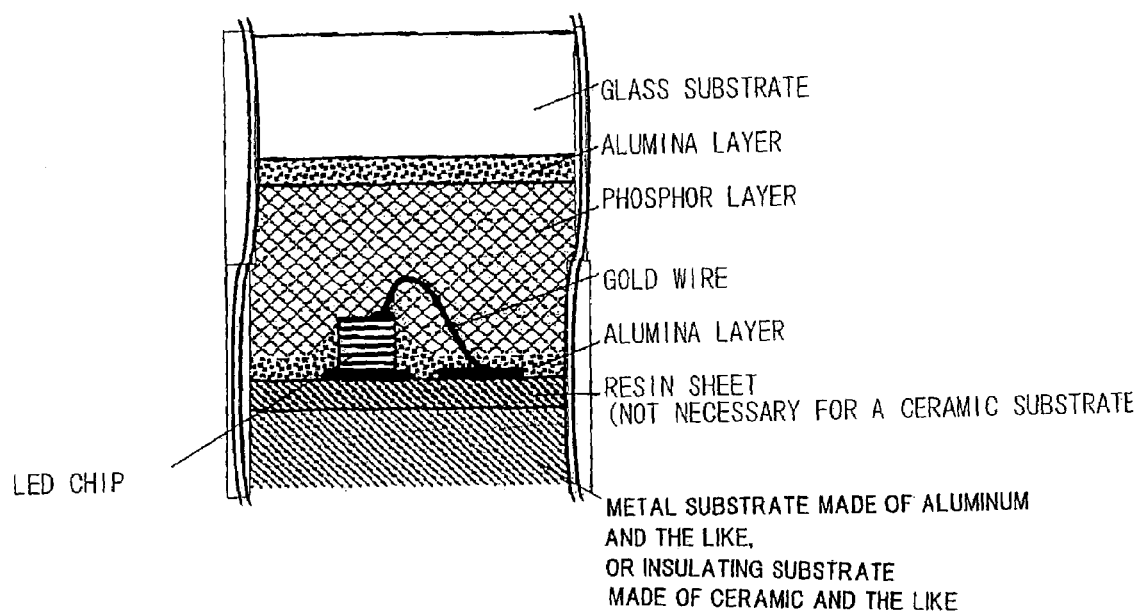
FIG. 15 is a partly enlarged view of an LED chip with a phosphor layer between the cover and substrate.

FIG. 14 is a sectional view of the illumination apparatus 6 which is taken along the plane A-A' shown in FIG. 13A.

Just as in the first embodiment described above, the substrate section 62 is equipped with a metal substrate 620, a resin layer 621, a first metal layer 622a, a second metal layer 622b, a resin layer 623, a metal layer 624, and the chips 626. Note that the difference with the first embodiment is that the metal substrate 620 is not provided with a concave, and that a resin layer is not formed over the metal layer 624, in this embodiment.

The cover 63, just as in the first embodiment, is equipped with a glass substrate 630, a light reflective layer 631, and a phosphor layer 632. The cover 63 is mounted so as to cover the concave 62a of the substrate section 62. A metal cap 634 which is in frame structure holds the glass substrate 630 at the edge. A space formed between the metal cap 634 and the glass substrate 630 is filled with a glass 633 having low melting point, so as to assure hermeticity therebetween. The inside of the concave 62a is nitrogen purged, just as in the first embodiment.

The glass substrate 630 is made of a kovar glass (borosilicate glass). The metal cap 634 is made of kovar metal (an alloy of iron, nickel, and cobalt). The thermal expansion coefficients for the glass substrate 630 and the metal cap 634 are substantially the same.

In addition, the metal layer 624 of the substrate section 62 is also made of kovar metal, and so has the same thermal expansion coefficient as the metal cap 634.

Here, the metal layer 624 and the metal cap 634 are fixed around the opening of the concave 62a by electric welding method. This method is frequently used for securing caps of semiconductor laser elements, for which hermeticity is required. Here, even if these expand because of heat emitted from the chips 626, the hermeticity will be assured therebetween since the thermal expansion coefficients are the same for both. In addition, the low-melting point glass 633 is filled in a space between the metal cap 634 and the glass substrate 630. Since the thermal expansion coefficients are the same for the metal cap 634 and the glass substrate 630, the hermeticity of the concave 62 can be assured from the same reason as aforementioned.

According to the mentioned structure, when the cover 63 is fixed to the substrate section 62, it is not necessary to use resin which is likely to deteriorate by means of excitation light, therefore hermeticity of the cover 3 can be stably retained. Accordingly, water entry from outside can be restrained, thereby preventing deterioration of the phosphor layer, as well as preventing increase in leak current of the LED element. In addition, just as in the first embodiment, the chips 626 are surrounded by the light reflective layer 627, and so the heat emitted therefrom can be efficiently dissipated towards the metal substrate 620.

Note that in each of the embodiments, the light emission apparatus relating to the present invention is used as illumination apparatus. However, the light emission apparatuses each provided with respective phosphor layers emitting red, green, and blue, may be used as independent cell units from each other. Specifically, the mentioned light emission apparatuses, as a collection, may be used as a display apparatus, by being arranged in matrix formation, and by controlling time period for which light emission for each color lasts.

In addition, in the light emission apparatus of each of the aforementioned embodiments, a space is created between the substrate section and the cover. However, such a space is not always necessary, and another structure is also possible in which the space is filled with phosphor particles forming the phosphor layer (i.e. the structure that the phosphor layer is made to abut against the chips). According to this structure, there will be no distance between the phosphor layer and the chips, and so the illumination apparatus can be made even thinner.

In addition, the following structure is also possible. That is, blue light emission chips are used for the chips, and a material that turns the blue light into an excitation light of yellow is used for the phosphor layer. And that, white light may be arranged to be emitted, by synthesizing the color of the light emitted from the chips and the color of the excitation light emitted from the phosphor layer. Alternatively, it is also possible to use chips that emit blue light, and to use a phosphor layer that, in addition to turning the blue light into yellow excitation light, turns the blue light into red excitation light. This also enables white light to be emitted, by synthesizing the color of the light emitted from the chips and the color of the excitation light emitted from the phosphor layer. By arranging as above, the same effect as the one obtained by each of the embodiments is obtained, because the color of the emitted light from the chips and the color of the excitation light from the phosphor layer are synthesized to emit white light. In this case, however, it is requires care in selecting the color emitted by the chips, and also in selecting the materials for the phosphor layer, in order to generate a resulting color to be white.

Furthermore, it is also possible to do without the phosphor layers 32, 632, or without the light reflective layers 31, 631, and to only provide a glass substrate as the cover so as to use the emitted light from the chips as direct light source.

As described so far, according to the light emission apparatus of the present invention, an insulation resin layer covers the metal substrate which is for dissipating heat, and the light emission elements are provided over the resin layer, and a light reflective layer made of metal oxide particles is provided over the areas of the resin layer where there are not the light emission elements. Therefore, the light reflective layer is able to reflect the excitation light that causes deterioration of the resin layer, even if a light emitted from the light emission element, such as ultraviolet light and blue light, is reflected by the cover to be irradiated back to the resin layer, or if such a light is irradiated direct to the resin layer. Here, since the light reflective layer is made by providing metal oxide particles over the area of the resin layer excluding its light emitting surface, so as further to cover the side surface of each light emitting element. This enables the heat emitted from the light emitting elements to dissipate also via the side surface thereof, toward the metal substrate, thereby helping improve the heat-dissipating efficiency of the light emission apparatus. By these, the light emission apparatus is given realistic structure which is suitable for actual use. In addition, if the ceramic substrate is endowed with the similar structure, it can reflect the excitation light and white light, thereby enhancing the conversion efficiency.

Although the present invention has been fully described by way of examples with references to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A light emission apparatus comprising:
a substrate that dissipates heat;
an insulation film that covers a main surface of the substrate;
a metal wiring pattern provided on the insulation film;

a light emission chip that is mounted above the insulation film, is connected to the metal wiring pattern, and emits light having a peak wavelength in a range of 250 nm to 480 nm inclusive; and a light reflective layer that is made of particles of metal oxide and is provided at any place that has the insulation film thereunder, but not light emitting surface of the light emission chip thereunder.

2. The light emission apparatus of claim 1, wherein the particles of metal oxide line an average particle diameter of 0.50 μm or below.

3. The light emission apparatus of claim 1, wherein the metal oxide is selected from the group consisting of $Al_2O_3$ and ZnO.

4. The light emission apparatus of claim 1, wherein the light emission chip is made of either a resonant light emitting diode or a vertical-cavity surface-emitting laser element.

5. The light emission apparatus of claim 1, further comprising a covering member that covers the light emission chip and is made from a glass substrate, and a phosphor layer that is provided on a main surface of the glass substrate facing the light emission chip and that is excited by light omitted from the light emission chip thereby emitting excitation light.

6. The light emission apparatus of claim 5, wherein the light emission chip is made to abut spinet the phosphor layer.

7. The light emission apparatus of claim 5, wherein the phosphor layer is made of either: a composition that emits white excitation light by being excited by the light emitted from the light emission chip; or a composition that emits such excitation light that, when synthesized with the light from the light emitting chip, yields white light.

8. The light emission apparatus of claim 2, wherein the metal oxide is selected from the group consisting of $Al_2O_3$ and ZnO.

9. A light emission apparatus comprising:

a substrate that dissipates heat;

an insulation film that covers a main surface of the substrate;

a metal wiring pattern provided on the insulation film;

a light emission chip that is mounted above the insulation film, is connected to the metal wiring pattern, and emits light having a peak wavelength in a range of 250 nm to 480 nm inclusive; and a light reflective layer that is made of particles of metal oxide and is provided at any place tat has the insulation film thereunder, but not light emitting surface of the light emission chip thereunder, wherein a thread hole and a groove are provided with respect to the substrate in a position where the light emission chip is provided in a plan view, the groove being to absorb distortion which occurs when the substrate expands due to heat.

10. The light emission apparatus of claim 9, wherein the particles of metal oxide have an average particle diameter of 0.50 μm or below.

11. The light emission apparatus of claim 10, wherein the metal oxide is selected from the group consisting of $Al_2O_3$ and ZnO.

12. The light emission apparatus of claim 9, wherein the light emission chip is made of either a resonant light emitting diode or a vertical-cavity surface-emitting laser element.

13. A light emission apparatus comprising:

a substrate that dissipates heat;

an insulation film that covers a main surface of the substrate;

a metal wiring pattern provided on the insulation film;

a light emission chip that is mounted above the insulation film, is connected to the metal wiring pattern, and emits light having a peak wavelength in a range of 250 nm to 480 nm inclusive;

a light reflective layer that is made of particles of metal oxide and is provided at any place that has the insulation film thereunder, but not light emitting surface of the light emission chip thereunder;

a covering member that covers the light emission chip and is made from a glass substrate; and a phosphor layer that is provided on a main surface of the glass substrate facing the light emission chip and that is excited by light emitted from the light emission chip thereby emitting excitation light, wherein the glass substrate of the covering member is fitted into a metal frame that is fixed to the substrate by means of welding.

14. The light emission apparatus of claim 13, wherein the particles of metal oxide have an average particle diameter of 0.50 μm or below.

15. The light emission apparatus of claim 13, wherein the metal oxide is selected from the group consisting of $Al_2O_3$ and ZnO.

* * * * *